United States Patent [19]
Cargill

[11] Patent Number: 5,748,027
[45] Date of Patent: May 5, 1998

[54] LOW POWER, HIGH LINEARITY LOG-LINEAR CONTROL METHOD AND APPARATUS

[75] Inventor: Robert S. Cargill, Portland, Oreg.

[73] Assignee: Maxim Integrated Products, Inc., Sunnyvale, Calif.

[21] Appl. No.: 794,836

[22] Filed: Feb. 3, 1997

[51] Int. Cl.[6] .................. H03G 11/08; G06G 7/12
[52] U.S. Cl. .................. 327/350; 330/254; 327/306; 327/563
[58] Field of Search .................. 330/254; 327/560–563, 327/63–65, 350, 306, 327

[56] References Cited

U.S. PATENT DOCUMENTS

| | | | |
|---|---|---|---|
| 4,065,725 | 12/1977 | Lillis et al. | 330/254 |
| 4,341,962 | 7/1982 | Buff | 327/306 |
| 4,344,044 | 8/1982 | Harford | 330/254 |
| 5,256,984 | 10/1993 | Lee | 330/254 |
| 5,442,311 | 8/1995 | Trafton | 327/306 |
| 5,455,816 | 10/1995 | Biting | 330/254 |
| 5,477,191 | 12/1995 | Demicheli | 330/254 |
| 5,572,166 | 11/1996 | Gilbert | 330/254 |
| 5,587,688 | 12/1996 | Mulbrook | 330/254 |

*Primary Examiner*—Toan Tran
*Attorney, Agent, or Firm*—Blakely, Sokoloff, Taylor & Zafman LLP

[57] ABSTRACT

Low power, high linearity log-linear control method and apparatus wherein a master log-linear cell generates a control voltage that is buffered and applied to a slave log-linear cell. By breaking this function up into two pieces, the control loop characteristics are isolated from the signal path. Low impedance buffers can be used to drive the slave log-linear cell control ports, independent of the control loop, providing improved gain control range and linearity. This log-linear control is of particular value in applications that require low harmonic distortion and high gain control range in power or pin-constrained applications. Details of the method are disclosed.

13 Claims, 1 Drawing Sheet

MASTER-SLAVE LOG-LINEAR VARIABLE CURRENT GAIN CELL

PRIOR ART LOG-LINEAR
VARIABLE CURRENT GAIN CELL

MASTER-SLAVE LOG-LINEAR
VARIABLE CURRENT GAIN CELL

5,748,027

LOW POWER, HIGH LINEARITY LOG-LINEAR CONTROL METHOD AND APPARATUS

BACKGROUND OF THE INVENTION

1. Field of the Invention

The present invention relates to the field of log-linear control circuits.

2. Prior Art

In many communications systems, the tremendous variation in channel loss generates the need for a log-linear control, that is, one for which the gain in dB is a linear function of some control word or signal. One way of approaching the problem uses the exponential characteristic of the emitter-base junction of a bipolar junction transistor (BJT) to generate such a control. This works well for small signals and at low frequencies. However, difficulties are encountered in applying this approach to the higher frequencies and larger signals necessary in a typical transmitter. The problem is that the control loop runs at very low currents when the output signals are at their largest, and significant harmonic distortion can result. Large capacitors (>1 nF) provide some improvement, but in order to achieve the high linearity levels required for broadband transmitters, additional improvements are required.

The prior art, as shown in FIG. 1, uses a trio of BJTs Q1, Q2 and Q3 to construct a variable current gain cell. In this circuit, an input current Iin of frequencies in the bandpass of the communication channel or system provides an output signal current Iout of corresponding signal frequencies. First neglecting the signal current input, the differential gain control voltage VgcP,VgcN, as buffered by buffer amplifiers buffer1 and buffer2, is applied between the bases of transistors Q1 and Q3. Transistor Q3 has a known collector current forced by current source I2, and thus sets up a fixed voltage at its emitter relative to its base. At a zero differential input (VgcP=VgcN), the base-emitter voltage of transistor Q1 will be the same as the base-emitter voltage of transistor Q3, and thus, the current in transistor Q1 will be proportional to the current in transistor Q3, namely I2 times the relative size N of transistor Q1 to transistor Q3. Under this condition, transistors Q1 and Q3 will be operating with a base-emitter voltage Vbes, where the subscript "s" designates a zero differential input (VgcP=VgcN). Transistor Q2 provides a path for the excess signal current to flow by sensing the collector voltage of device Q3 through amplifier amp1 and forcing it to equal a reference voltage vref. This maintains a collector current in transistor Q3 that keeps transistor Q3 out of saturation. The excess current, that is, the bias current Ibias minus the current through transistors Q1 and Q3, is supplied by transistor Q2 when maintaining the collector voltage of transistor Q3.

When a differential gain control input VgcP,VgcN is applied, current I2 through transistor Q3 forces the base-emitter voltage of transistor Q3 to remain at Vbes, so that the entire differential input appears on the base-emitter voltage of transistor Q1. Transistor Q1 then biases with a collector current given by:

$$Ic=N*I2*\exp((q/KT)(VgcP-VgcN))$$

where:

Ic=collector current of transistor Q1
q=electron charge
K=Boltzmann constant
T=absolute temperature Thus an exponential characteristic is obtained from the collector current of Q1.

Now consider an input signal current Iin in addition to the bias current Ibias. In this circuit, amplifier amp1 is a low pass amplifier substantially nonresponsive to the signal frequencies of the input signal current. Thus the base voltage of transistor Q2, as well as the base voltage of transistor Q1, will be substantially free of the signal frequencies. Consequently the input signal current Iin will cause some variation in the common emitter connection voltage, and the input signal current Iin will divide between transistors Q1 and Q2 in a manner dependent on the relative base voltages thereof. The ratio of device sizes between transistors Q1, Q2 and Q3 determines the current division ratio for zero differential control voltage. Temperature compensation is provided by making the linear control voltage proportional to absolute temperature.

The problem with this log-linear control lies in the compensation. This control loop is notoriously difficult to stabilize in integrated form, requiring large capacitors to produce satisfactory AC performance. Also, the signal current disturbs the control loop. With the gain set to a maximum, the control loop runs at extremely low currents, so when the signal current disturbs the control loop, its response is sluggish and typically adds significant harmonic distortion to the output current. The signal current generates some voltage swing at the common emitter node, and although it is small, it only takes a couple of millivolts to result in 1 dB compression of peaks. In order to prevent this, the bases of all three devices must be held steady by a very low impedance. Such an impedance can't be generated using feedback in the control loop for stability reasons. On-chip capacitors of the necessary size are not realizable, and off-chip capacitors suffer from problems with coupling noise from the outside world, not to mention the effects of the series bondwire inductance. For maximum AC performance, a completely integrated approach must be used.

BRIEF SUMMARY OF THE INVENTION

In the present invention, a master-slave control is used, wherein the master generates a control voltage that is buffered and applied to the slave log-linear cell. By breaking this function up into two pieces, the control loop characteristics are isolated from the signal path. Low impedance buffers can be used to drive the slave log-linear cell control ports, independent of the control loop, providing improved gain control range and linearity. This log-linear control is of particular value in applications that require low harmonic distortion and high gain control range in power or pin-constrained applications.

DETAILED DESCRIPTION OF THE INVENTION

Figure 1:
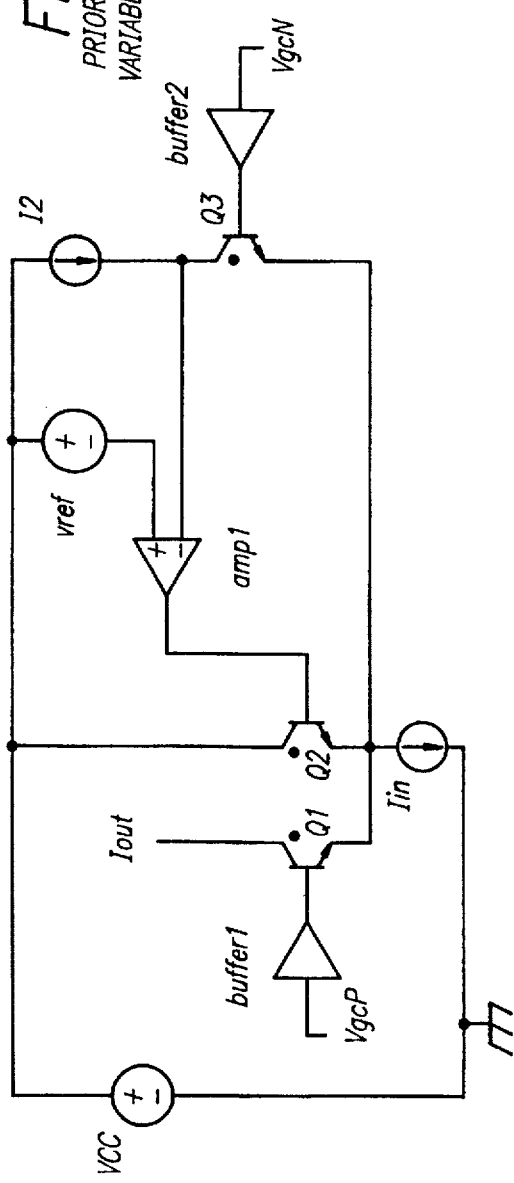
FIG. 1 is a circuit diagram for a prior art log-linear gain control circuit.

The trio of devices Q1, Q2 and Q3 of the prior art circuit of FIG. 1 has no fundamental limitation built in that makes it impossible to achieve better than 60 dB suppression of harmonics. However, it appears that realizable loop architectures provide inadequate characteristics to reach this goal. What has been found to be really necessary is to separate the log-linear control function from the variable gain function, so the signal current doesn't disturb the control loop in the first place.

Figure 2:
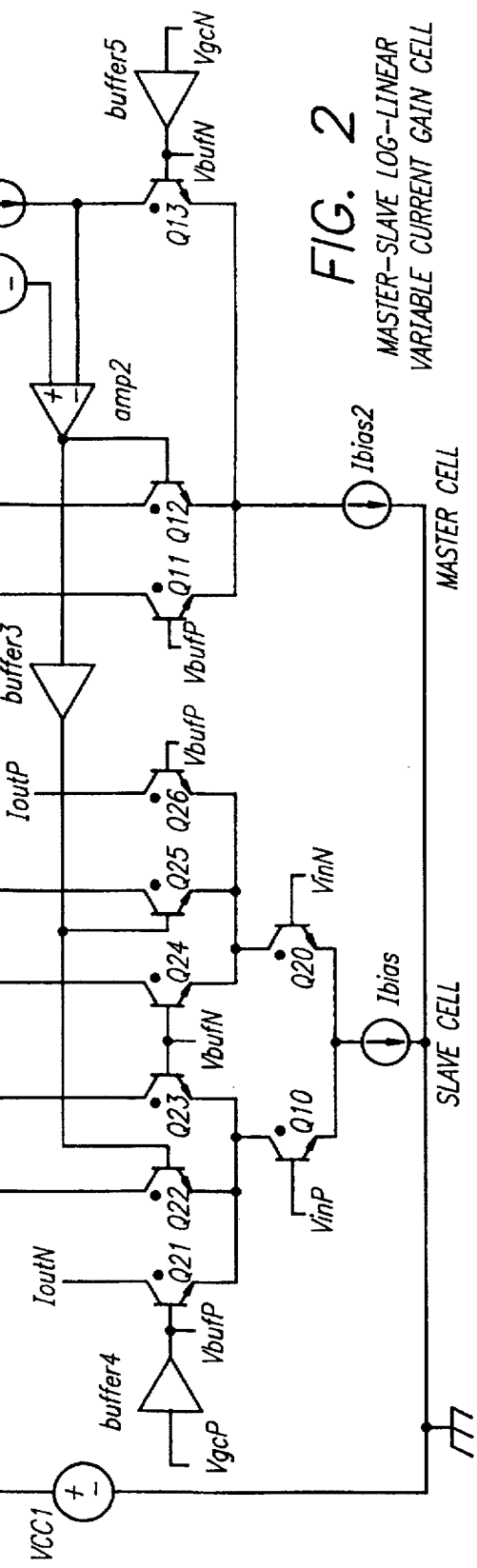
FIG. 2 is a circuit diagram for an exemplary log-linear gain control circuit of the present invention.

In order to do this, a master-slave log-linear control system was created. An embodiment of the invention having a differential input and a differential output is shown in FIG. 2. The differential input in this embodiment is a differential voltage input VinP,VinN applied to the bases of transistors Q10 and Q20. The control voltage VgcP,VgcN is applied to both a master and slave cell through buffer amplifiers buffer4 and buffer5. The master cell, composed of transistors Q11, Q12 and Q13, current sources Ibias2 and I8, voltage reference V4 and amplifier amp2, operates at low, constant current, with no signal current present. The devices used are ratioed down by a factor n to permit the use of smaller currents in the master cell. The master cell generates the necessary control voltage to drive the slave cell through buffer 3.

The slave cell is comprised of transistors Q21 through Q26, with the output current IoutP being taken from the collector of transistor Q26 and the complementary output current IoutN being taken from the collector of transistor Q21. In the circuit shown, transistors Q22 and Q25 have their bases connected to the output of buffer amplifier buffer3, and thus function in the circuit in the same manner as transistor Q12 in the master cell or transistor Q2 in the circuit of FIG. 1. Transistors Q23 and Q24 have their collectors connected to the positive power supply and their emitters connected to the collectors of transistors Q10 and Q20, respectively, as well as the emitters of transistors Q21 and Q22, and Q25 and Q26, respectively. The bases of transistors Q23 and Q24 are connected together and to the buffered signal VbufN, from the input signal VgcN as buffered by buffer5. All of transistors Q21 through Q26 are biased by the current source Ibias1 as divided between transistors Q10 and Q20 as a result of the differential input to the bases of those transistors VinP,VinN.

Assuming for the moment that the differential signal input VinP,VinN is zero, the current of current source Ibias1 will be equally divided between the group of transistors Q21, Q22 and Q23, and the group of transistors Q24, Q25 and Q26. Of the current through transistor Q10, that current in turn will be divided between transistors Q21, Q22 and Q23 based on their relative sizes, and the differential gain control input voltage VgcP,VgcN as buffered by buffer amplifiers buffer4 and buffer5. If VgcP equals VgcN, the base emitter voltages of all three transistors Q21, Q22 and Q23 should be substantially equal, so that the current will divide between the three of them in accordance with their relative sizes. If, on the other hand, VgcP is higher than VgcN, the current through transistor Q10 will be more heavily directed through transistor Q21, whereas if VgcP is less than VgcN, the current through transistor Q10 will be less directed through transistor Q21 and more directed through transistor Q22. Similarly, of the current through transistor Q20, more of that current will be directed through transistor Q26 if the gain control voltage VgcP is higher than the gain control voltage VgcN, but if the gain control voltage VgcN is higher than the gain control voltage VgcP, more of the current through transistor Q20 will be directed through transistor Q25 and less through transistor Q26. Thus it may be seen that the differential input transistors Q10 and Q20 divide the bias current Ibias1 in accordance with the differential input signal VinP,VinN. Those current components, in turn, are further subdivided so that the same fraction of each is provided as one of the current outputs IoutP,IoutN of the log-linear circuit responsive to the differential control voltage input VgcP,VgcN. The net effect is that the control loop comprising transistors Q11, Q12 and Q13 may be stabilized and operated without disturbance of the signal current (or signal voltage) and that a complementary differential input will provide a corresponding complementary differential output having a gain on the differential output controlled by the differential control voltage VgcP,VgcN. Obviously, while a preferred embodiment has been disclosed herein based on the use of npn bipolar transistors, the invention may also be realized using pnp transistors if desired.

Because the functions of gain and control are separated, signal currents do not affect the control loop operation. Also, identical low impedance buffers can be employed to drive all three transistors Q11, Q12 and Q13 in the slave cell, an absolute necessity to minimize harmonic distortion in the signal current. In that regard, the circuit shown in FIG. 2 is intended for fabrication in integrated circuit form, as proper circuit operation is dependent upon matched transistors for transistors Q11, Q12, Q13 and Q21–Q26. For this purpose, two transistors are considered to be matched if the two transistors will conduct current in proportion to their relative sizes when biased with the same base-emitter voltages.

The result of the present invention is a fully integrated, low power, high linearity current gain cell with an extremely wide log-linear gain control range. In the case of the prior art circuit, a circuit having a single ended current input and a single ended current output was illustrated. With respect to the exemplary embodiment of the present invention, a circuit having a differential voltage input VinP,VinN and a differential current output IoutP,IoutN has been disclosed. The differential input VinP,VinN to transistors Q10 and Q20 biased by bias current Ibias1 is in effect a differential current input, the two transistors plus the bias current converting the differential voltage input VinP,VinN to a differential current input, as seen by the circuits connected to the collectors of transistors Q10 and Q20. Accordingly, the bias current applied to the circuit comprised of transistors Q21, Q22 and Q23 may be considered to be Ibias½ plus an input signal current Iin, and the current provided to the circuit comprising transistors Q24, Q25 and Q26 may be considered to be a bias current Ibias½ minus Iin.

It was previously pointed out that in the prior art circuit of FIG. 1, amplifier amp1 is a low pass amplifier substantially nonresponsive to the signal frequencies of the input signal current. In the present invention, this low pass restriction is no longer applicable, as the master log-linear circuit operates free of the presence of the input signal. This simplifies the design of amplifier amp2 and eliminates the need for capacitors large enough to assure the previously required low pass characteristics.

While the present invention has been disclosed and described with respect to a certain preferred embodiment thereof, it will be understood to those skilled in the art that the present invention may be varied without departing from the spirit and scope thereof.

What is claimed is:

1. A log-linear gain control circuit comprising:
   a log-linear master control circuit providing a control voltage; and,
   a log-linear slave circuit referenced to the control voltage and responsive to an input signal to provide an output signal having a gain controlled by a gain control signal.

2. The log-linear gain control circuit of claim 1 wherein the input signal and the output signal are differential signals.

3. The log-linear gain control circuit of claim 1 wherein the gain control signal is a differential signal.

4. The log-linear gain control circuit of claim 1 wherein the input signal, the output signal and the gain control signal are differential signals.

5. A log-linear gain control circuit comprising:

first and second power supply terminals a log-linear master control circuit having first, second and third transistors, each having an emitter, a base and a collector, the emitters of the first, second and third transistors being coupled together, the collectors of the first and second transistors being coupled to the first power supply terminal, the collector of the third transistor being coupled to the first power supply terminal through a current source;

a second current source, the common emitter connection of the first, second and third transistors being coupled to the second power supply terminal through the second current source;

the base of one of the first and third transistors being coupled to a gain control input;

a circuit providing a control voltage controlling the base of the second transistor to maintain a voltage on the collector of the third transistor; and, a log-linear slave circuit referenced to the control voltage and responsive to an input signal to provide an output signal having a gain controlled by a gain control signal.

6. The log-linear gain control circuit of claim 5 wherein the bases of the first and third transistors are coupled to a differential gain control input.

7. The log-linear gain control circuit of claim 5 wherein the slave circuit is responsive to a differential input signal to provide a differential output signal having a gain controlled by a differential gain control signal.

8. The log-linear gain control circuit of claim 5 wherein the log-linear slave circuit comprises:

fourth, fifth and sixth transistors, each having an emitter, a base and a collector, the emitters of the fourth, fifth and sixth transistors being coupled together, the collectors of the fourth and fifth transistors being coupled to the first power supply terminal, the collector of the sixth transistor being coupled to an output signal current line;

a third current source, the common emitter connection of the fourth, fifth and sixth transistors being coupled to the second power supply terminal through the third current source, the third current source having a constant current portion and an input signal current portion;

the bases of one of the fourth and sixth transistors being coupled to a gain control input; and, the base of the fifth transistor being coupled to the control voltage.

9. The log-linear gain control circuit of claim 8 wherein the third current source comprises a fourth current source and seventh and eighth transistors, each having an emitter, a base and a collector, the emitters of the seventh and eighth transistors being coupled together and to the fourth current source, the collector of the seventh transistor being coupled to the common emitter connection of the fourth, fifth and sixth transistors, the bases of the seventh and eighth transistors being coupled to a differential input signal.

10. A method of providing gain control comprising the steps of:

providing as a single integrated circuit, a log-linear master control circuit and a log-linear slave circuit;

operating the log-linear circuit master without an input signal to provide a log-linear circuit control signal;

operating the log-linear slave circuit using the control signal provided by the master log-linear circuit to provide an output signal responsive to an input signal and a gain control signal.

11. The method of claim 10 wherein the input signal and the output signal are differential signals.

12. The method of claim 10 wherein the gain control signal is a differential signal.

13. The method of claim 10 wherein the input signal, the output signal and the gain control signal are differential signals.

\* \* \* \* \*